US008563992B2

(12) United States Patent
Kato et al.

(10) Patent No.: US 8,563,992 B2
(45) Date of Patent: Oct. 22, 2013

(54) LIGHT EMITTING APPARATUS AND MULTI-SURFACE PATTERN SUBSTRATE

(75) Inventors: Hideaki Kato, Saitama (JP); Yasutaka Higuchi, Saitama (JP)

(73) Assignee: Enplas Corporation, Saitama (JP)

(*) Notice: Subject to any disclaimer, the term of this patent is extended or adjusted under 35 U.S.C. 154(b) by 48 days.

(21) Appl. No.: 13/218,677

(22) Filed: Aug. 26, 2011

(65) Prior Publication Data

US 2012/0056210 A1 Mar. 8, 2012

(30) Foreign Application Priority Data

Sep. 2, 2010 (JP) ................. 2010-196766

(51) Int. Cl.
*H01L 27/15* (2006.01)
(52) U.S. Cl.
USPC .............. 257/88; 438/29; 438/22; 438/28; 438/26; 438/47
(58) Field of Classification Search
USPC ................... 438/22, 26, 28, 29, 47
See application file for complete search history.

(56) References Cited

U.S. PATENT DOCUMENTS

| 2006/0091416 A1* | 5/2006 | Yan ................... 257/99 |
| 2010/0038657 A1* | 2/2010 | Higuchi et al. ......... 257/88 |
| 2010/0068839 A1* | 3/2010 | Ray et al. ............. 438/29 |

FOREIGN PATENT DOCUMENTS

| JP | 2007-048883 A | | 2/2007 |
| JP | 200748883 | * | 2/2007 |
| JP | 2007048883 A | * | 2/2007 |

* cited by examiner

*Primary Examiner* — Benjamin Sandvik
*Assistant Examiner* — Rodolfo Fortich
(74) *Attorney, Agent, or Firm* — Washida & Associates

(57) ABSTRACT

A light emitting apparatus includes a belt-like substrate, a light emitting element mounted on the substrate, and a luminous flux control member mounted on the substrate. The substrate has a pair of fracture surfaces formed at predetermined intervals along a lengthwise direction and formed at both ends in a widthwise direction between luminous flux control members neighboring each other along the lengthwise direction, wherein dimensions W1 and W2 in the widthwise direction between the pair of fracture surfaces are less than a dimension in the widthwise direction of the luminous flux control member, and the dimension W2 in the widthwise direction of a part overlapping the luminous flux control member in a plan view is less than the dimension W1 in the widthwise direction between the pair of fracture surfaces.

3 Claims, 14 Drawing Sheets

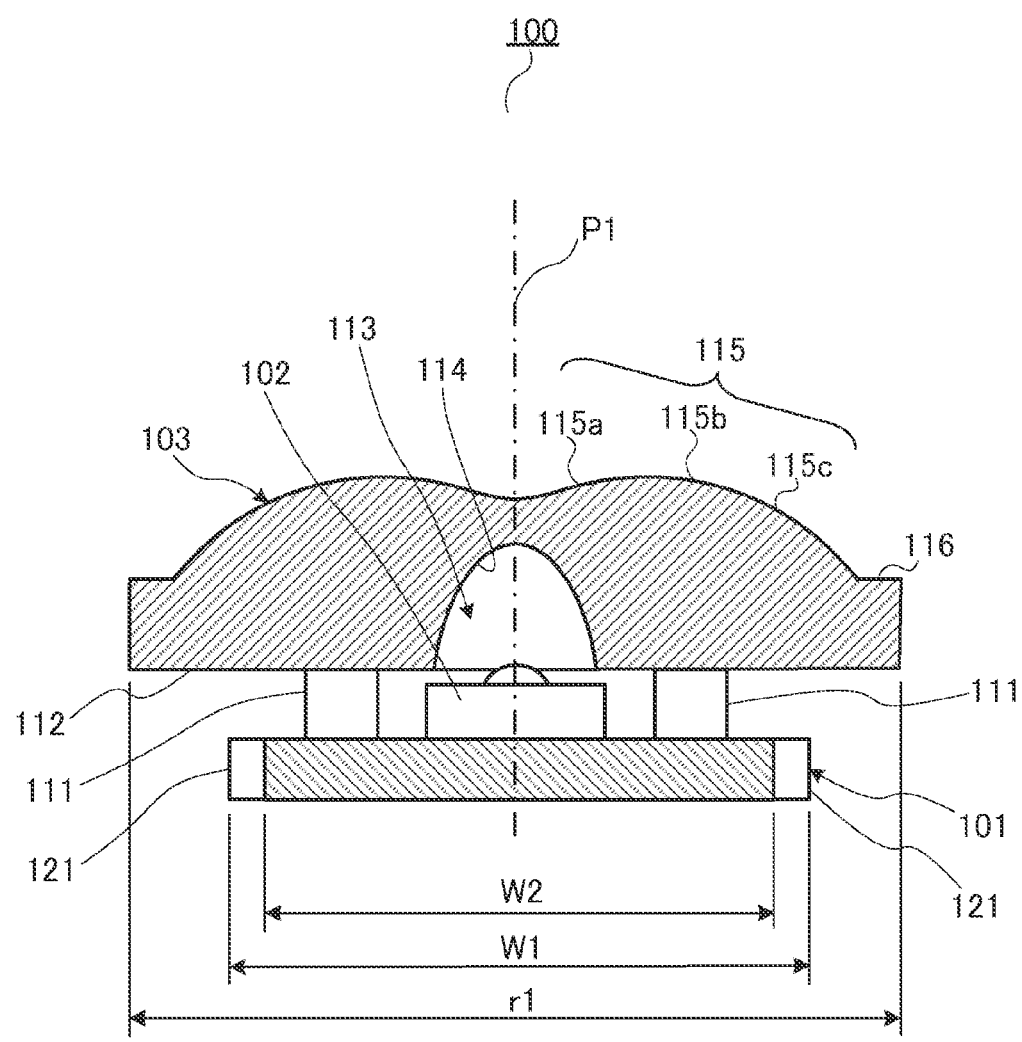
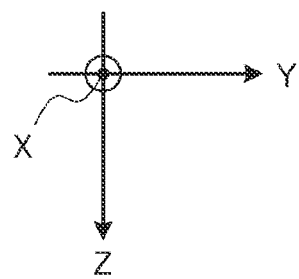
FIG.2

LIGHT EMITTING APPARATUS AND MULTI-SURFACE PATTERN SUBSTRATE

CROSS REFERENCE TO RELATED APPLICATIONS

The disclosure of Japanese Patent Application No. 2010-196766, filed on Sep. 2, 2010, including the specification, drawings and abstract, is incorporated herein by reference in its entirety.

TECHNICAL FIELD

The present invention relates to a light emitting apparatus for illuminating a surface to be illuminated, and a multi-surface pattern substrate.

BACKGROUND ART

There is an illuminating apparatus for illuminating a surface to be illuminated, such as a signboard on which letters or drawings are shown for advertisement or a liquid crystal of a liquid crystal television set. Such illuminating apparatus has a light emitting apparatus in which a plurality of light emitting elements such as light emitting diodes and luminous flux control members for receiving light emitted from the light emitting elements and emitting light upon controlling distribution of the incident light are mounted on a substrate (for example, patent literature 1). This light emitting apparatus is formed by mounting the light emitting elements and the luminous flux control members on a multi-surface pattern substrate and cutting the multi-surface pattern substrate in predetermined parts. In this case, the width of a product substrate constituting the light emitting apparatus is formed to be larger than the dimension of the outermost diameter of the luminous flux control member constituting the light emitting apparatus. The product substrate is a substrate formed by cutting the multi-surface pattern substrate in predetermined parts.

On this kind of conventional multi-surface pattern substrate for forming the light emitting apparatus, adjacent light emitting elements and luminous flux control members of adjacent light emitting apparatus are arranged neighboring each other in a matrix form. The width of the product substrate is designed to be sufficiently wider than the dimension of the outer diameter of the luminous flux control member, and the luminous flux control members are arranged with clearances formed there between. Therefore, when the product substrates are formed by cutting the multi-surface pattern substrate, a problem of inability to cut the multi-surface pattern substrate due to the luminous flux control members residing thereon does not occur.

Patent Literature 1: Japanese Patent Application Laid-Open No. 2007-48883

However, when the width of the product substrate is reduced in order to increase the number of product substrates formed from one multi-surface pattern substrate, adjacent luminous flux control members cannot be mounted because they interfere with each other if the luminous flux control members of the same dimension as the conventional dimension are arranged in the same matrix form as the conventional matrix form. On the contrary, when a product substrate is cut from the multi-surface pattern substrate upon reducing the width of the product substrate of one light emitting apparatus, and the luminous flux control member is mounted on the substrate, the substrate cannot be cut due to the luminous flux control member. Therefore, the width of the product substrate cannot be reduced, and there is a problem in that the manufacturing cost of the illuminating apparatus cannot be reduced.

As compared with the conventional one, it is therefore an object of the present invention to provide a light emitting apparatus and a multi-surface pattern substrate capable of increasing the number of substrates formed from one multi-surface pattern substrate and capable of reducing the manufacturing cost.

SUMMARY OF INVENTION

A light emitting apparatus according to the present invention is a light emitting apparatus for illuminating a surface to be illuminated, and employs a configuration in which: the light emitting apparatus comprises: a belt-like substrate; a plurality of light emitting elements mounted on a mount surface of the substrate at predetermined intervals along a lengthwise direction of the substrate; and a plurality of luminous flux control members mounted on the mount surface at the predetermined intervals along the lengthwise direction, the luminous flux control members respectively receiving lights emitted from the light emitting elements, controlling an arrangement of the incident lights, and emitting the incident lights in an emission direction; and the substrate comprises a pair of fracture surfaces formed at predetermined intervals along the lengthwise direction and formed at both ends in a widthwise direction between luminous flux control members neighboring each other along the lengthwise direction, a dimension in the widthwise direction between the pair of fracture surfaces being less than a dimension in the widthwise direction of the luminous flux control member, and the dimension in the widthwise direction of a part overlapping the luminous flux control member in a plan view being less than the dimension in the widthwise direction between the pair of fracture surfaces A multi-surface pattern substrate according to the present invention is separated into a plurality of parts and thereby forming a plurality of belt-like substrates on each of which a light emitting element and a luminous flux control member are mounted, and, employs a configuration to include: a mount surface on which the light emitting elements and the luminous flux control members are mounted; through-holes arranged at predetermined intervals on each separation line serving as a boundary of the separation and penetrating the multi-surface pattern substrate in a thickness direction; and a cutting guide section arranged on the separation line between neighboring through-holes on each separation line, the cutting guide section being a groove made to a predetermined depth from at least one of a back surface or the mount surface serving as a surface of the multi-surface pattern substrate.

According to the present invention, the multi-surface pattern substrate is cut and processed, so that a light emitting apparatus having a substrate having a narrow width in which the luminous flux control member projects from the sides of the substrate can be formed. As compared with the conventional one, the number of substrates formed from one multi-surface pattern substrate can be increased, and the manufacturing cost can be reduced.

BRIEF DESCRIPTION OF DRAWINGS

FIG. 2 is a cross sectional view taken along A-A line of FIG. 1;

DESCRIPTION OF EMBODIMENTS

Embodiments of the present invention will be hereinafter described in detail with reference to drawings.

First Embodiment (Configuration of Light Emitting Apparatus)

Figure 1:
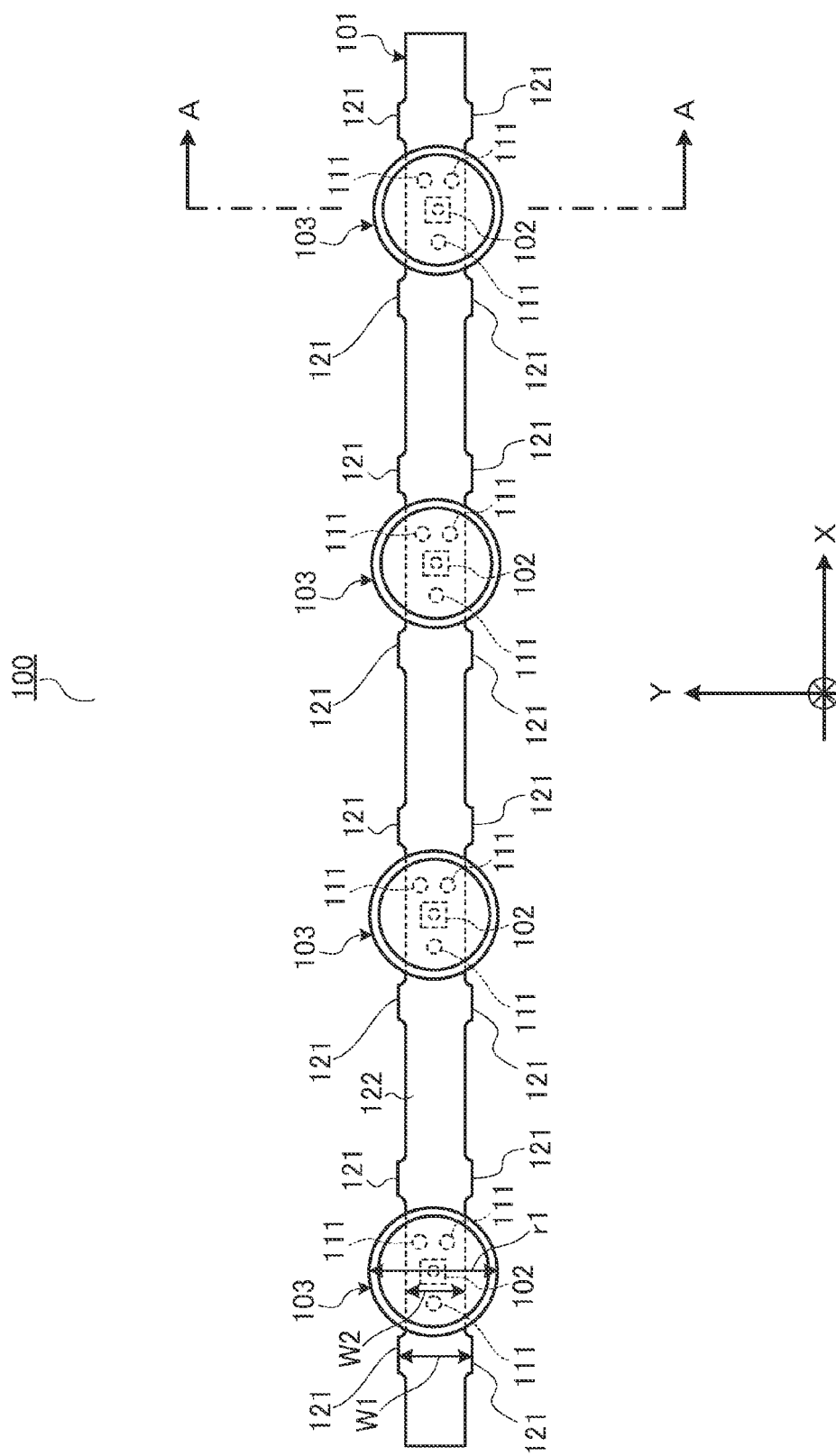
FIG. 1 is a plan view illustrating a light emitting apparatus according to a first embodiment of the present invention.

A configuration of light emitting apparatus 100 will be hereinafter described in detail with reference to FIGS. 1 and 2. FIG. 1 is a plan view illustrating light emitting apparatus 100 according to the present embodiment. FIG. 2 is a cross sectional view taken along A-A line of FIG. 1. In FIGS. 1 and 2, X axis, Y axis, and Z axis are perpendicular to each other.

Light emitting apparatus 100 mainly includes substrate 101, light emitting element 102, and luminous flux control member 103.

Product substrate (hereinafter referred to as "substrate") 101 is in a long and narrow belt shape. Substrate 101 is formed with an insulating material. Substrate 101 is formed with a conductive circuit pattern, not shown, electrically connected to a conductive terminal, not shown, of light emitting element 102.

Substrate 101 is formed with fracture surfaces 121 Fracture surface 121 is a side surface of substrate 101 located at a position perpendicular to mount surface 122 on which light emitting element 102 and luminous flux control member 103 are mounted. Fracture surfaces 121 are formed at both ends in a widthwise direction of substrate 101 (direction parallel to Y axis in FIG. 1). When light emitting element 102 and luminous flux control member 103 are mounted on substrate 101, fracture surface 121 is formed on the side surface of substrate 101 between luminous flux control members 103 neighboring each other along a lengthwise direction of substrate 101 (direction parallel to X axis in FIG. 1) at predetermined intervals along the lengthwise direction of substrate 101. Fracture surface 121 is formed by cutting a part integrally connected with adjacent substrate 101 in the multi-surface pattern substrate described later. Substrate 101 is formed so that dimension W1 and dimension W2 in the widthwise direction of substrate 101 are smaller than dimension r1 of luminous flux control member 103 in the widthwise direction (W1<r1 and W2<r1). In the plan view, substrate 101 is formed such that dimension W3 in the widthwise direction of a part overlapping luminous flux control member 103 is smaller than length W1 in the widthwise direction of a part where fracture surface 121 is formed (W1>W2).

Light emitting elements 102 are mounted on mount surface 122 of substrate 101 at regular intervals along the lengthwise direction of substrate 101. The conductive terminals, not shown, of light emitting elements 102 are soldered to the conductive circuit pattern of substrate 101, so that light emitting elements 102 are mounted to substrate 101. Light emitting element 102 emits light when electric power is provided to light emitting element 102 via the circuit pattern of substrate 101. Light emitting element 102 is, for example, a light emitting diode.

Luminous flux control members 103 are mounted on mount surface 122 of substrate 101 at regular intervals along the lengthwise direction of substrate 101 (direction parallel to X axis in FIG. 1). The planar shape of luminous flux control member 103 is in a circular shape having a center on a center axis P1 (see FIG. 2). Luminous flux control member 103 is mounted on substrate 101 so that center axis P1 of luminous flux control member 103 matches the optical axis of light emitting element 102. Luminous flux control member 103 has leg sections 111 formed to project from bottom surface 112 in a direction parallel to Z axis in FIG. 1, wherein leg sections 111 are formed at positions of the vertexes of an isosceles triangle on bottom surface 112. When leg sections 111 are fixed to substrate 101, luminous flux control member 103 is mounted on substrate 101 while bottom surface 112 is in parallel with mount surface 122 of substrate 101 and a predetermined clearance is maintained therebetween. Luminous flux control member 103 is mounted on substrate 101 by adhering end parts of leg sections 111 to mount surface 122 of substrate 101 using, for example, an adhesive agent.

As shown in FIG. 2, luminous flux control member 103 has recessed section 113 formed by inwardly denting bottom surface 112 facing light emitting element 102. On the inner surface of recessed section 113 of luminous flux control member 103, input surface 114 is formed in a rotationally symmetrical manner about center axis P1. Further, luminous flux control member 103 includes output surface 115 including first output surface 115a, second output surface 115b formed continuously around first output surface 115, and third output surface 115c formed in a place connecting second output surface 115b with flange section 116.

First output surface 115a is a smooth curved surface shape projecting downward, which is a recessed shape obtained by cutting off a part of a sphere. Second output surface 115b is a smooth curved surface shape projecting upward that is formed continuously from first output surface 115a, and the planar shape of second output surface 115b is formed substantially in a hollow disc plate shape enclosing first output surface 115a. Third output surface 115c is formed continuously from second output surface 115b.

Light emitted from light emitting element 102 enters input surface 114 of luminous flux control member 103 Luminous flux control member 103 controls distribution of the incident light emitted from light emitting element 102 into a distribution that is different from the distribution of the incident light emitted from light emitting element 102 so as to obtain illumination distribution required on light diffusion member 400 of illuminating apparatus 900 described later, and emits the light through output surface 115 in an emission direction.

(Configuration of Multi-Surface Pattern Substrate)

Figure 3:
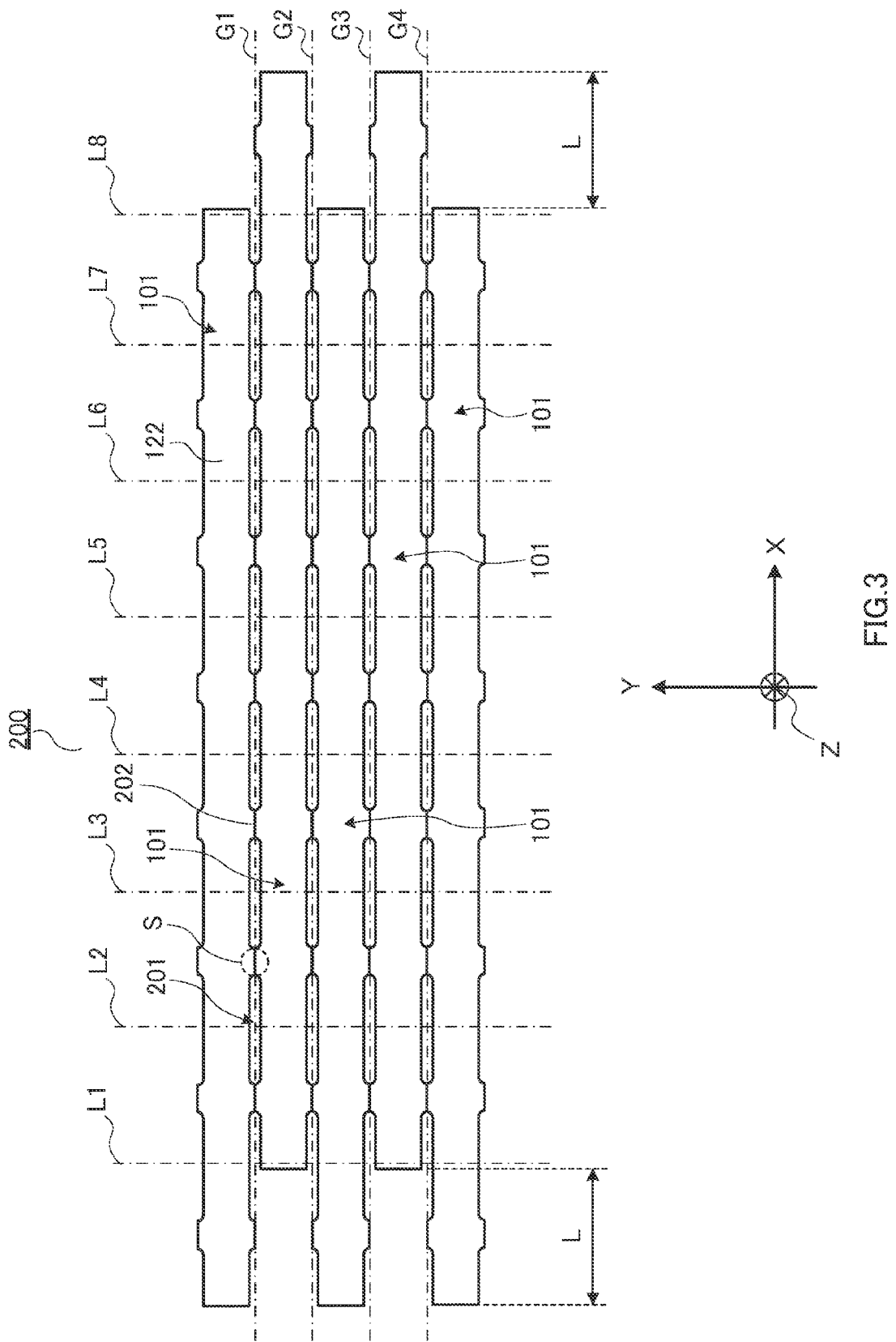
FIG. 3 is a plan view illustrating a multi-surface pattern substrate according to the first embodiment of the present invention.

The configuration of multi-surface pattern substrate 200 will be hereinafter described in detail with reference to FIG. 3. FIG. 3 is a plan view illustrating multi-surface pattern substrate 200. In FIG. 3, X axis, Y axis, and Z axis are perpendicular to each other. In FIG. 3, parts having the same configurations as those of FIGS. 1 and 2 are denoted with the same reference numerals, and description thereof will not be repeated here is omitted.

Multi-surface pattern substrate 200 is formed with plurality of through-holes 201. In each of lines G1 to G4 on mount surface 122, plurality of through-holes 201 are formed at predetermined intervals along a lengthwise direction of multi-surface pattern substrate 200 (direction parallel to X axis in FIG. 3). In each of columns L1 to L8 on mount surface 122, plurality of through-holes 201 are formed at predetermined intervals in a direction perpendicular to the lengthwise direction of multi-surface pattern substrate 200 (direction parallel to Y axis in FIG. 3). Through-holes 201 are formed to penetrate multi-surface pattern substrate 200 in a direction parallel to Z axis in FIG. 3. Through-hole 201 is formed in a long hole shape such that the lengthwise direction (direction parallel to X axis in FIG. 3) is a longer diameter, and the direction perpendicular to the lengthwise direction (direction parallel to Y axis in FIG. 3) is a shorter diameter. Multi-surface pattern substrate 200 also has cutting guide sections 202 formed to serve as a guide during cutting process. Cutting guide section 202 are arranged on each of lines G1 to G4 between neighboring through-holes 201 in each of lines G1 to G4. Cutting guide section 202 is a groove formed from mount surface 122 to a predetermined depth. Multi-surface pattern substrate 200 has plurality of substrates 101 integrally connected with each other via cutting guide sections 202. On multi-surface pattern substrate 200, substrates 101 are alternately displaced by a predetermined length L (see FIG. 3) along the lengthwise direction (direction parallel to X axis in FIG. 3), so that both end parts thereof along the lengthwise direction are placed in a checkered pattern.

The multi-surface pattern substrate 200 having the above configuration is separated by the lines G1 to G4, so that plurality of substrates 101 are formed. When cutting guide sections 202 are cut on multi-surface pattern substrate 200, fracture surfaces 121 of each substrate 101 (see FIGS. 1 and 2) are formed.

Figure 4:
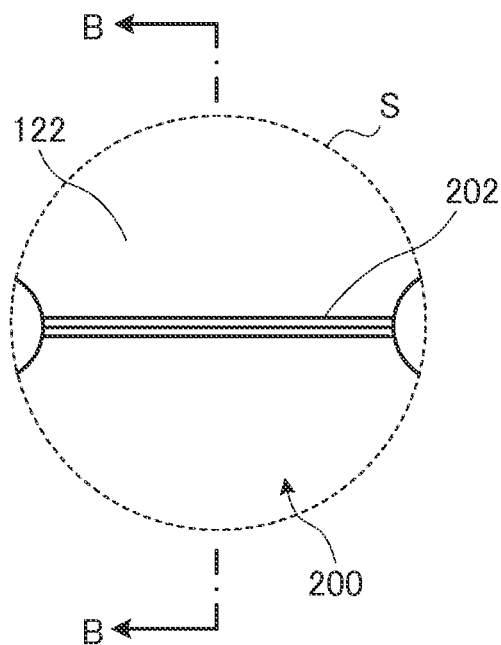
FIG. 4 is an enlarged plan view of part S in FIG. 3.
Figure 5:
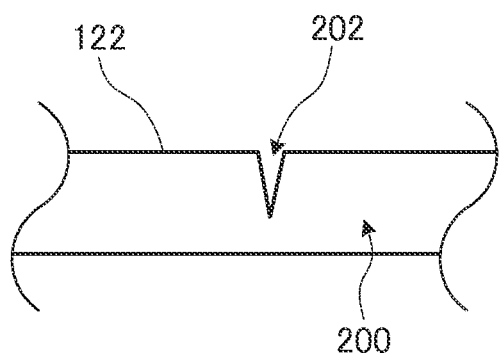
FIG. 5 is a cross sectional view taken along line B-B of FIG. 4.

FIG. 4 is an enlarged plan view of part S in FIG. 3. FIG. 5 is a cross sectional view taken along line B-B of FIG. 4.

As shown in FIGS. 4 and 5, cutting guide section 202 is a V groove formed from mount surface 122 to a predetermined depth in a direction parallel to Z axis in FIG. 3 (thickness direction of multi-surface pattern substrate 200).

(Method of Assembling Light Emitting Apparatus)

Figure 6:
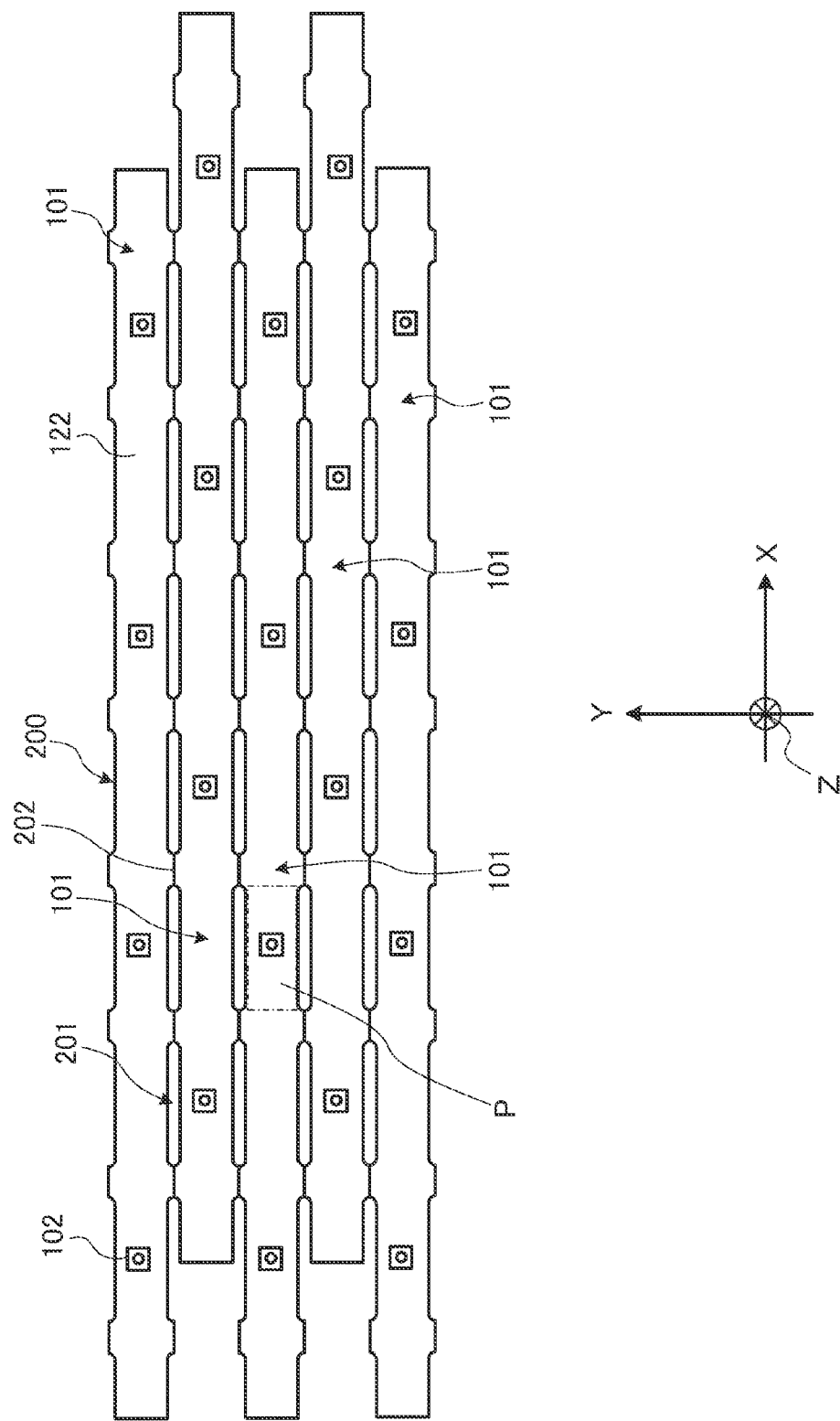
FIG. 6 is a plan view illustrating a multi-surface pattern substrate on which light emitting elements according to the first embodiment of the present invention are mounted.
Figure 7:
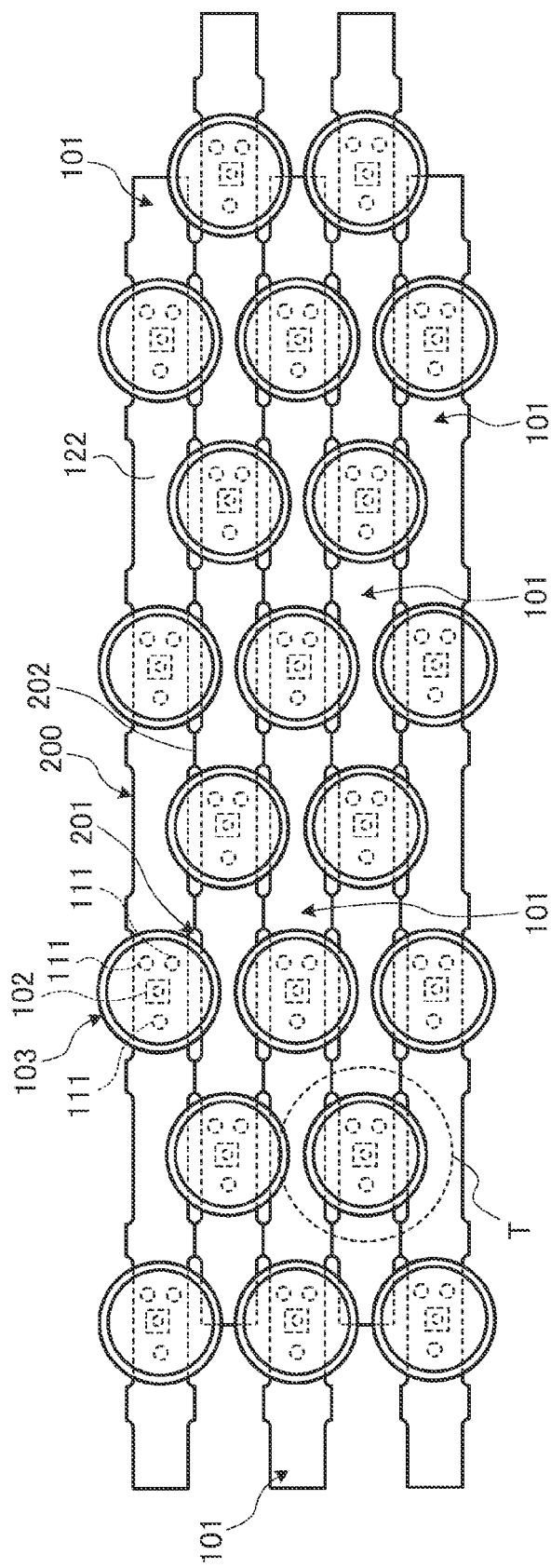
FIG. 7 is a plan view illustrating a multi-surface pattern substrate on which light emitting elements and luminous flux control members according to the first embodiment of the present invention are mounted.
Figure 8:
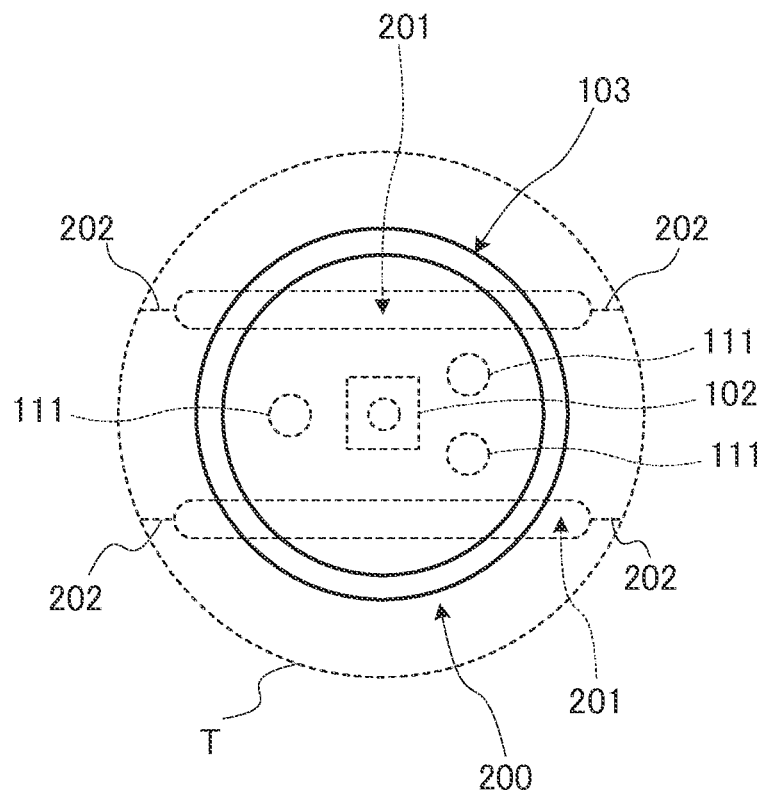
FIG. 8 is an enlarged plan view illustrating part T in FIG. 7.

A method of assembling light emitting apparatus 100 according to the present embodiment will be hereinafter described with reference to FIGS. 6 to 8. FIG. 6 is a plan view illustrating multi-surface pattern substrate 200 on which light emitting elements 102 are mounted. FIG. 7 is a plan view illustrating multi-surface pattern substrate 200 on which light emitting elements 102 and luminous flux control members 103 are mounted. FIG. 8 is an enlarged plan view illustrating part T in FIG. 7. In FIGS. 6 and 7, X axis, Y axis, and Z axis are perpendicular to each other. In FIGS. 6 to 8, parts having the same configurations as those of FIGS. 1 to 5 are denoted with the same reference numerals, and description thereof will not be repeated here is omitted.

First, as shown in FIG. 6, light emitting elements 102 are mounted on multi-surface pattern substrate 200. At this occasion, light emitting element 102 is mounted in each part P (a part enclosed by a broken line in FIG. 6) sandwiched between through-holes 201 neighboring each other in a direction (direction parallel to Y axis in FIG. 6) perpendicular to a lengthwise direction of multi-surface pattern substrate 200 (direction parallel to X axis in FIG. 6) in each of columns L1 to L8 (see FIG. 3).

Subsequently, as shown in FIG. 7, luminous flux control member 103 is mounted in part P (see FIG. 6) on multi-surface pattern substrate 200 where light emitting element 102 is mounted, so that light emitting element 102 is covered with luminous flux control member 103. In this case, light emitting elements 102 and luminous flux control members 103 are arranged in a checkered pattern on multi-surface pattern substrate 200 on a plan view. For example, luminous flux control members 103 are mounted on multi-surface pattern substrate 200 with an interval of 50 mm along the lengthwise direction of multi-surface pattern substrate 200.

In this configuration, as shown in FIG. 8, a central portion of through-hole 201 overlaps luminous flux control member 103, and both end parts along the lengthwise direction of through-hole 201 are exposed from luminous flux control member 103 on a plan view.

Subsequently, on multi-surface pattern substrate 200 in the state as shown in FIG. 7, cutting guide sections 202 on each of lines G1 to G4 (see FIG. 3) are cut using a long-bladed cutter, whereby light emitting apparatus 100 as shown in FIGS. 1 and 2 are formed. At this occasion, it is not necessary to cut through-holes 201 since through-holes 201 already penetrate multi-surface pattern substrate 200 in the direction parallel to Z axis of FIGS. 6 and 7. Therefore, even when the diameter of the circle of the circular shape of luminous flux control member 103 is larger than the length in the widthwise direction of substrate 101, each substrate 101 can be cut from multi-surface pattern substrate 200.

(Configuration of Illuminating Apparatus)

Figure 9:
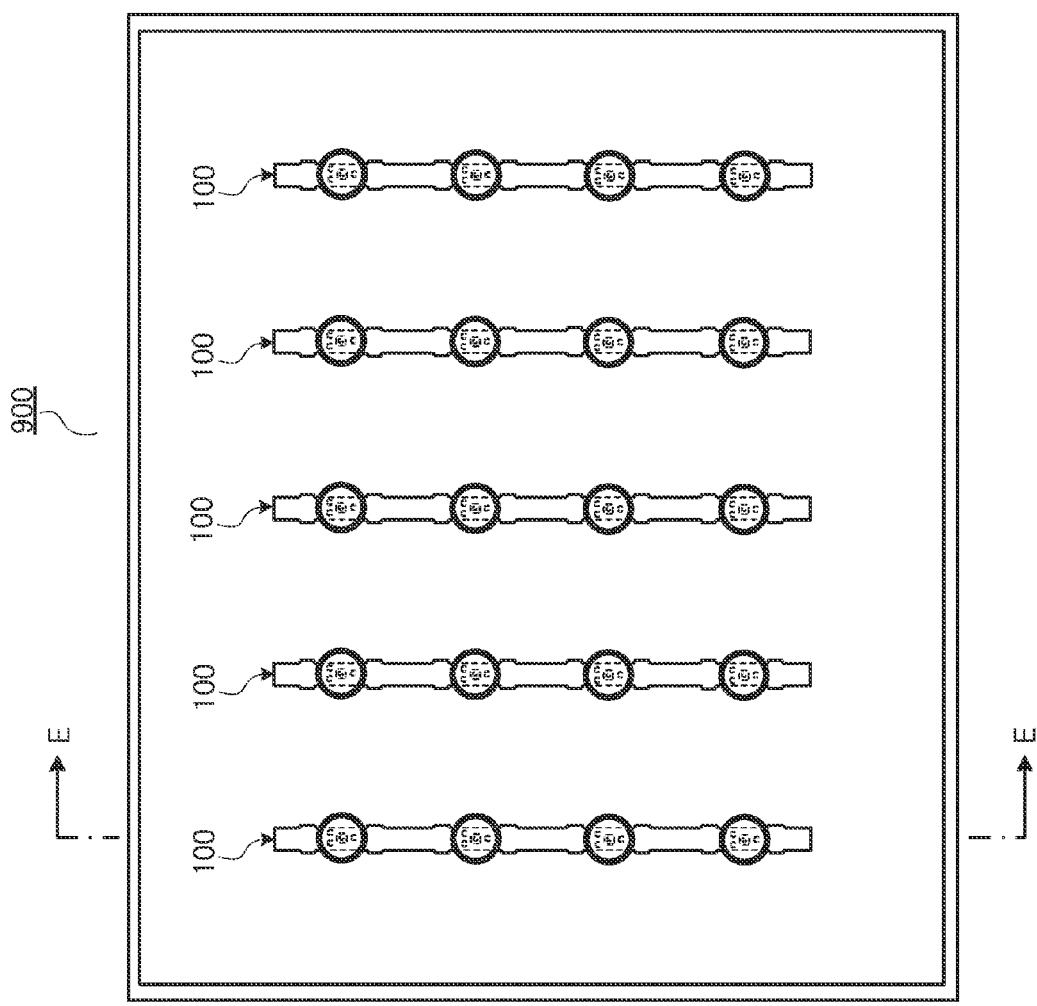
FIG. 9 is a plan view illustrating an illuminating apparatus according to the first embodiment of the present invention.
Figure 10:
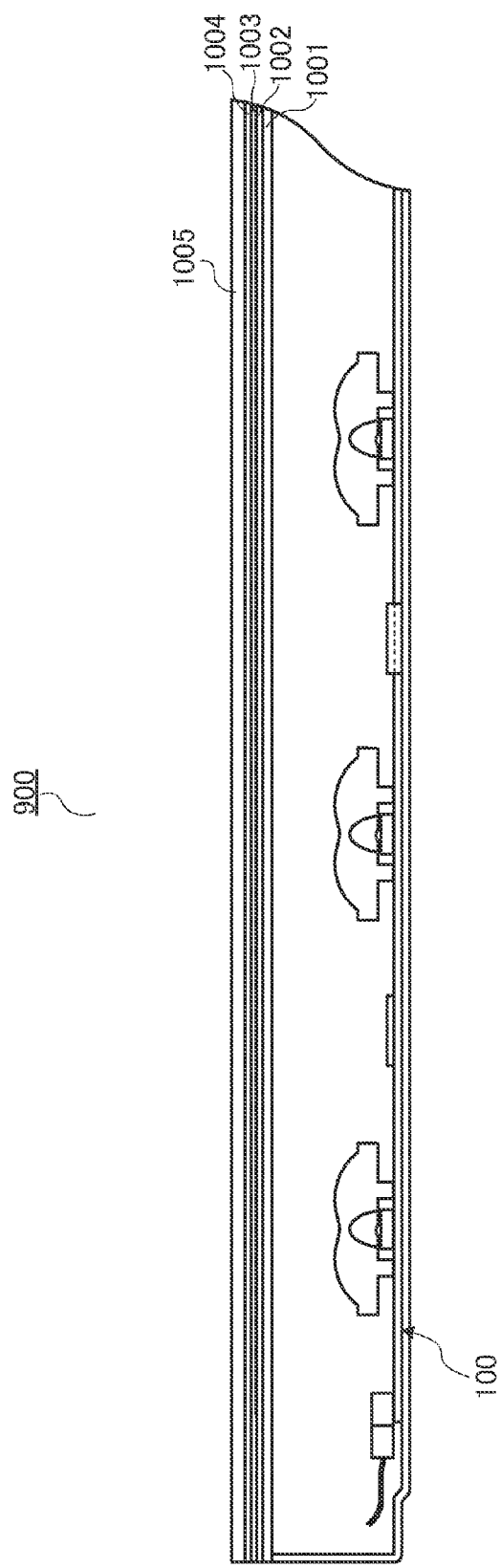
FIG. 10 is a cross sectional view taken along line E-E of FIG. 11.

The configuration of illuminating apparatus 900 will be hereinafter described in detail with reference to FIGS. 9 and 10. FIG. 9 is a plan view illustrating illuminating apparatus 900. FIG. 10 is a cross sectional view taken along line E-E of FIG. 9. FIG. 9 shows illuminating apparatus 900 without diffusion plate 1001, diffusion sheet 1002, first optical sheet 1003, second optical sheet 1004, and liquid crystal 1005, which are described later.

As shown in FIG. 9, illuminating apparatus 900 has plurality of light emitting apparatuses 100 arranged at predetermined intervals therein.

Diffusion plate 1001, diffusion sheet 1002, first optical sheet 1003, second optical sheet 1004, liquid crystal 1005, and the like are laminated on each of light emitting apparatuses 100 on illuminating apparatus 900.

In illuminating apparatus 900 having the above configuration, the arrangement of light emitted from light emitting element 102 of light emitting apparatus 100 is controlled by luminous flux control member 103, and the arranged light is emitted from luminous flux control member 103 Then, the light emitted from luminous flux control member 103 is diffused by diffusion plate 1001 and diffusion sheet 1002, and the optical characteristics of the light are controlled by first optical sheet 1003 and second optical sheet 1004, so that the light illuminates the back surface of liquid crystal 1005 (i.e. the surface to be illuminated).

(Variation of Cutting Guide Section)

Figure 11:
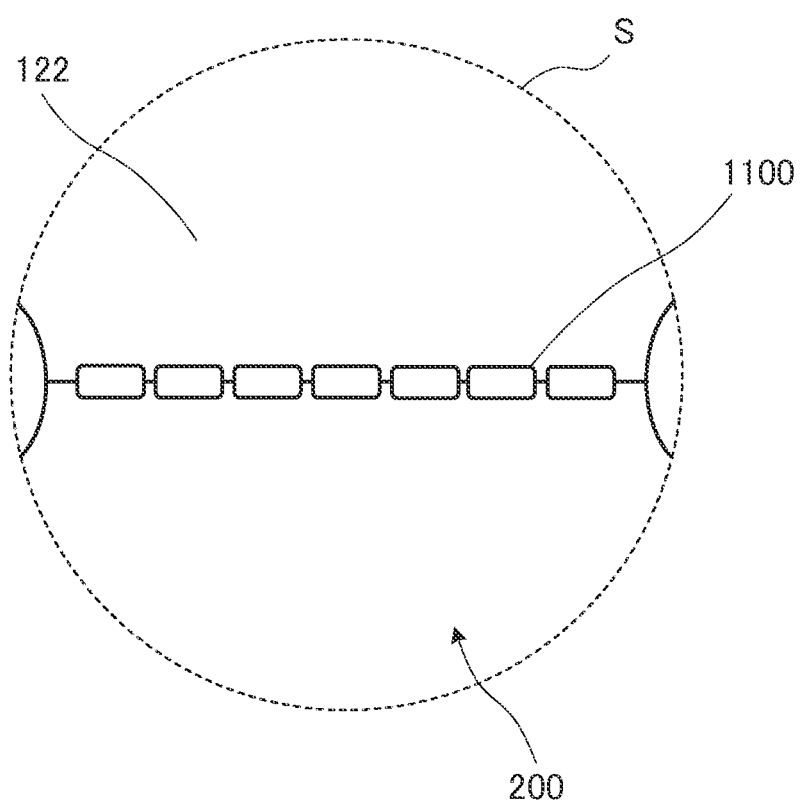
FIG. 11 is an enlarged plan view illustrating a part corresponding to part S in FIG. 3 according to a variation of a cutting guide section according to the first embodiment of the present invention.

Cutting guide sections 202 formed in the thickness direction of multi-surface pattern substrate 200 are not limited to V grooves made in a straight line. Alternatively, cutting guide sections 202 may be in any shape such as a through-hole FIG. 11 is an enlarged plan view illustrating a part corresponding to part S in FIG. 3 according to a variation of cutting guide section 202 according to the present embodiment. For example, as shown in FIG. 11, cutting guide section 202 may include not only V grooves formed in a straight line but also plurality of through-holes 1100 formed in the straight line, wherein the planar shape of each through-hole 1100 may be in a rounded rectangle (i.e. a rectangular shape whose four corners are rounded). Cutting guide section 202 is not limited to the shape shown in FIG. 11. Alternatively, cutting guide section 202 may include not only V grooves formed in a straight line but also plurality of through-holes formed in the straight line, wherein the planar shape of each through-hole may be in an elongated rectangle. Cutting guide section 202 is not limited to the shape of FIG. 11. Alternatively, cutting guide section 202 may include not only V grooves formed in a straight line but also plurality of through-holes formed in the straight line, wherein the planar shape of each through-hole may be in an elliptical shape. It should be noted that it is not necessary to form the straight V grooves when the through-holes are formed with a narrow pitch, and the dimension of connecting area between neighboring substrates 101 can be reduced to such an extent that substrates 101 can be easily cut from multi-surface pattern substrate 200 In other words, the shape and the depth of the groove of cutting guide section 202 are not limited as long as they are configured to reduce the dimension of connecting area between neighboring substrates 101.

(Variation of Illuminating Apparatus)

Figure 12:
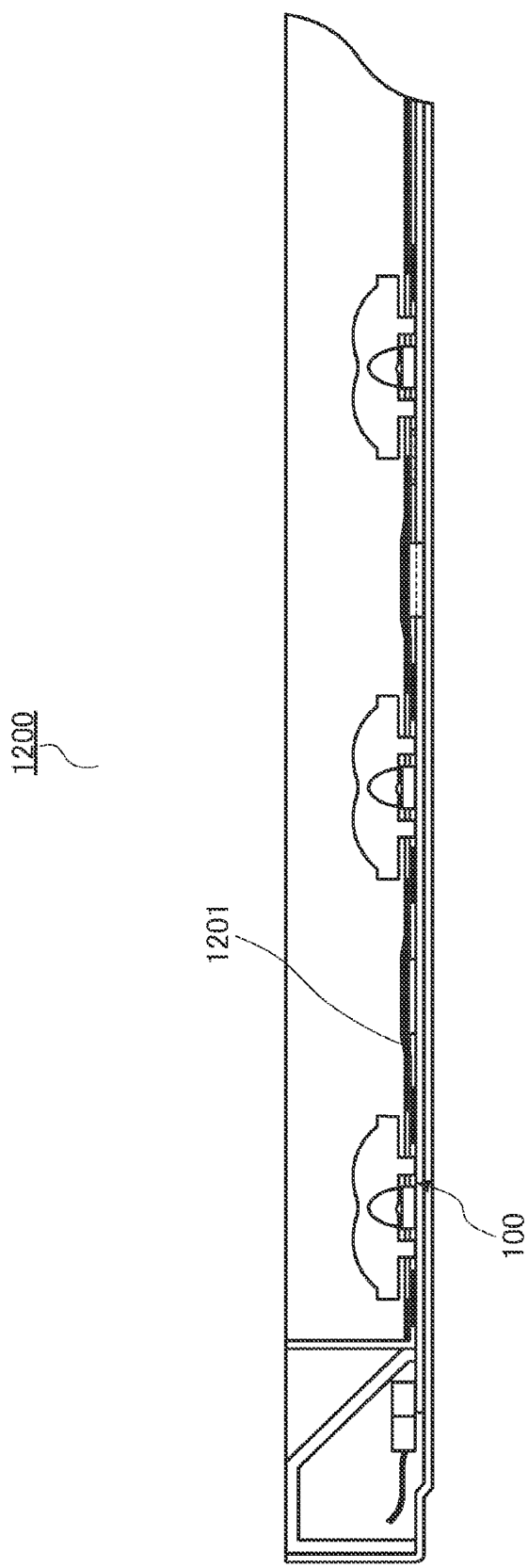
FIG. 12 is a cross sectional view corresponding to the cross sectional view taken along line E-E of FIG. 9 illustrating a variation of an illuminating apparatus according to Embodiment 1 of the present invention.

FIG. 12 is a cross sectional view corresponding to the cross sectional view taken along line E-E of FIG. 9 illustrating a variation of an illuminating apparatus. In FIG. 12, parts having the same configurations as those of FIGS. 1 and 10 are denoted with the same reference numerals, and description thereof will not be repeated here is omitted. For the sake of convenience of explanation, in FIG. 12, diffusion plate 1001, diffusion sheet 1002, first optical sheet 1003, second optical sheet 1004, and liquid crystal 1005 are omitted.

As shown in FIG. 12, illuminating apparatus 1200 is different from the configurations of FIGS. 9 and 10 in that white reflection sheet 1201 covering light emitting apparatus 100 is provided. Reflection sheet 1201 covers mount surface 122 of substrate 101 except for the parts where light emitting elements 102 and luminous flux control members 103 are mounted. As a result, reflection sheet 1201 can reflect, in a direction in which liquid crystal 1005 is arranged, light emitted from light emitting element 102 but not entering input surface 114 of luminous flux control member 103 and light entering luminous flux control member 103 but leaked from parts other than output surface 115.

(Effects of Present Embodiment)

As described above, in the present embodiment, in each line of the multi-surface pattern substrate, through-holes are formed at positions where luminous flux control members are mounted, so that even when the width of the substrate is reduced, the multi-surface pattern substrate can be cut and processed to form the substrates. Therefore, according to the present embodiment, the number of substrates formed from one multi-surface pattern substrate can be increased, and the manufacturing cost can be reduced.

Furthermore, according to the present embodiment, the luminous flux control members are mounted on the multi-surface pattern substrate in a checkered pattern, and this prevents interference between the luminous flux control members when the luminous flux control members are mounted.

Second Embodiment (Configuration of Multi-Surface Pattern Substrate)

Figure 13:
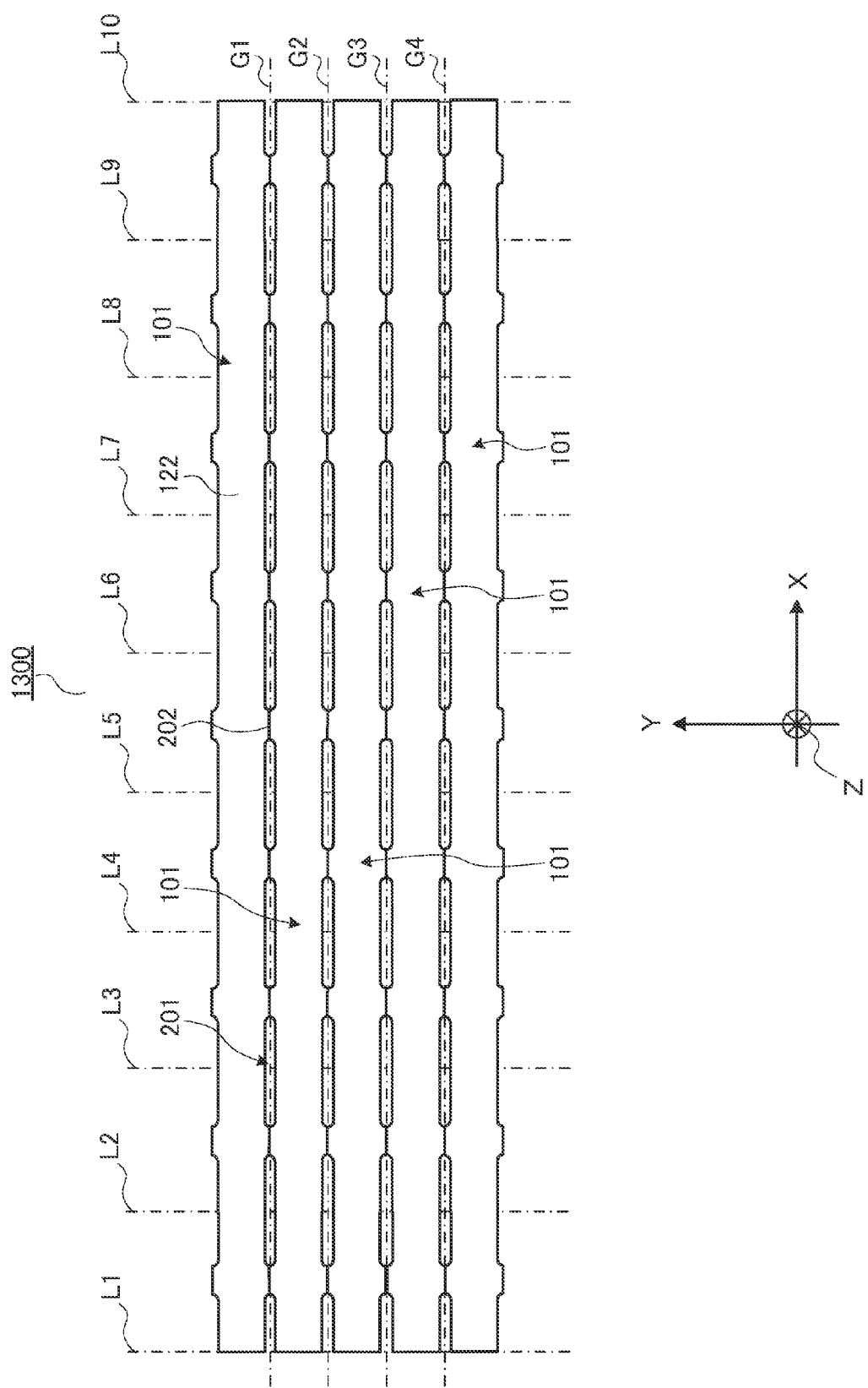
FIG. 13 is a plan view illustrating a multi-surface pattern substrate according to a second embodiment of the present invention.

FIG. 13 is a plan view illustrating multi-surface pattern substrate 1300 according to the second embodiment of the present invention. In FIG. 13, X axis, Y axis, and Z axis are perpendicular to each other. In FIG. 13, parts having the same configurations as those of FIG. 3 are denoted with the same reference numerals, and description thereof will not be repeated here is omitted.

Multi-surface pattern substrate 1300 is formed with plurality of through-holes 201. In each of lines G1 to G4 on mount surface 122, plurality of through-holes 201 are formed at predetermined intervals along a lengthwise direction of multi-surface pattern substrate 1300 (direction parallel to X axis in FIG. 13). In each of columns L1 to L10 on mount surface 122, plurality of through-holes 201 are formed at predetermined intervals in a direction perpendicular to the lengthwise direction of multi-surface pattern substrate 1300 (direction parallel to Y axis in FIG. 13). Through-holes 201 are formed to penetrate mount surface 122 in a mounting direction (direction parallel to Z axis in FIG. 13). Through-hole 201 is formed in a long hole shape such that the lengthwise direction (direction parallel to X axis in FIG. 13) is a longer diameter, and the direction perpendicular to the lengthwise direction (direction parallel to Y axis in FIG. 13) is a shorter diameter. Multi-surface pattern substrate 1300 also has cutting guide sections 202 formed to serve as a guide during cutting process. Cutting guide section 202 are arranged on each of lines G1 to G4 between neighboring through-holes 201 in each of lines G1 to G4. Cutting guide section 202 is a groove formed from mount surface 122 to a predetermined depth. Multi-surface pattern substrate 1300 has plurality of substrates 101 integrally connected with each other via cutting guide sections 202. Multi-surface pattern substrate 1300 is formed such that both ends thereof along the lengthwise direction respectively are at the same positions in each substrate 101.

The multi-surface pattern substrate 1300 having the above configuration is separated by the lines G1 to G4, so that plurality of substrates 101 are formed. When cutting guide sections 202 are cut on multi-surface pattern substrate 1300, fracture surfaces 121 of each substrate 101 (see FIG. 1) are formed.

The configuration of cutting guide section 202 is the same as those of FIGS. 4 and 5, and therefore, description thereof will not be repeated here is omitted.

(Method of Assembling Light Emitting Apparatus)

Figure 14:
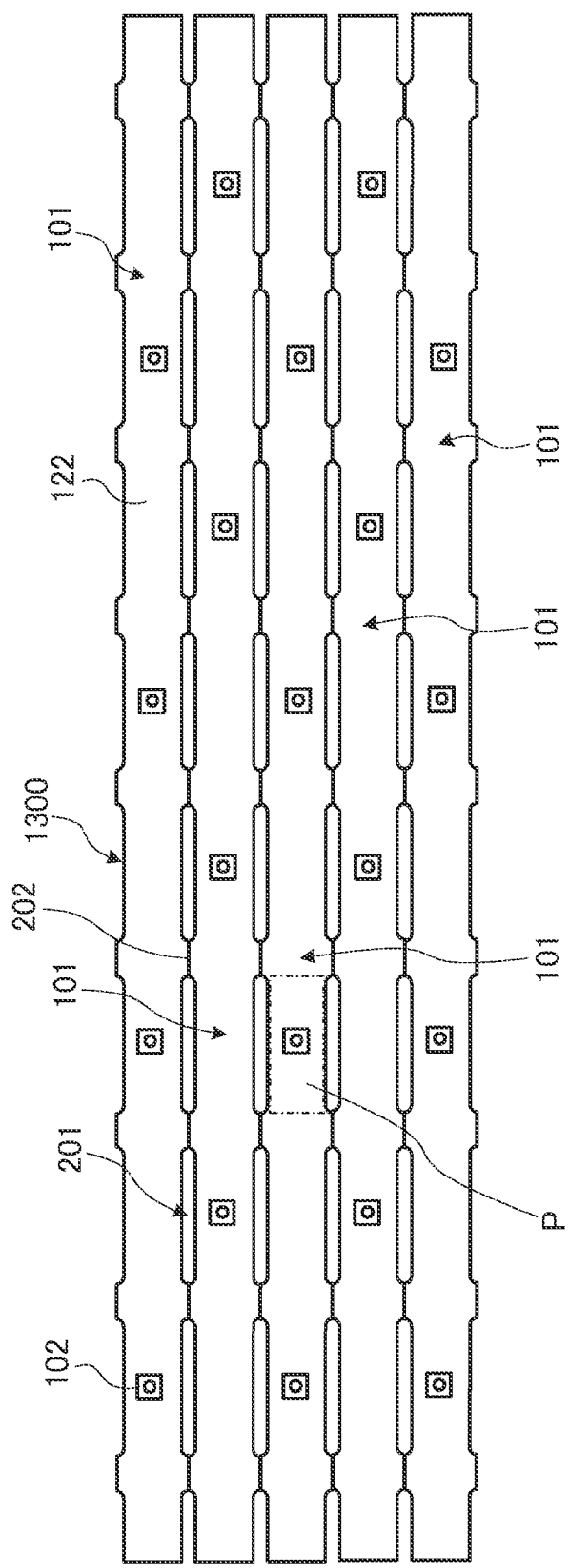
FIG. 14 is a plan view illustrating a multi-surface pattern substrate on which light emitting elements according to the second embodiment of the present invention are mounted.
Figure 15:
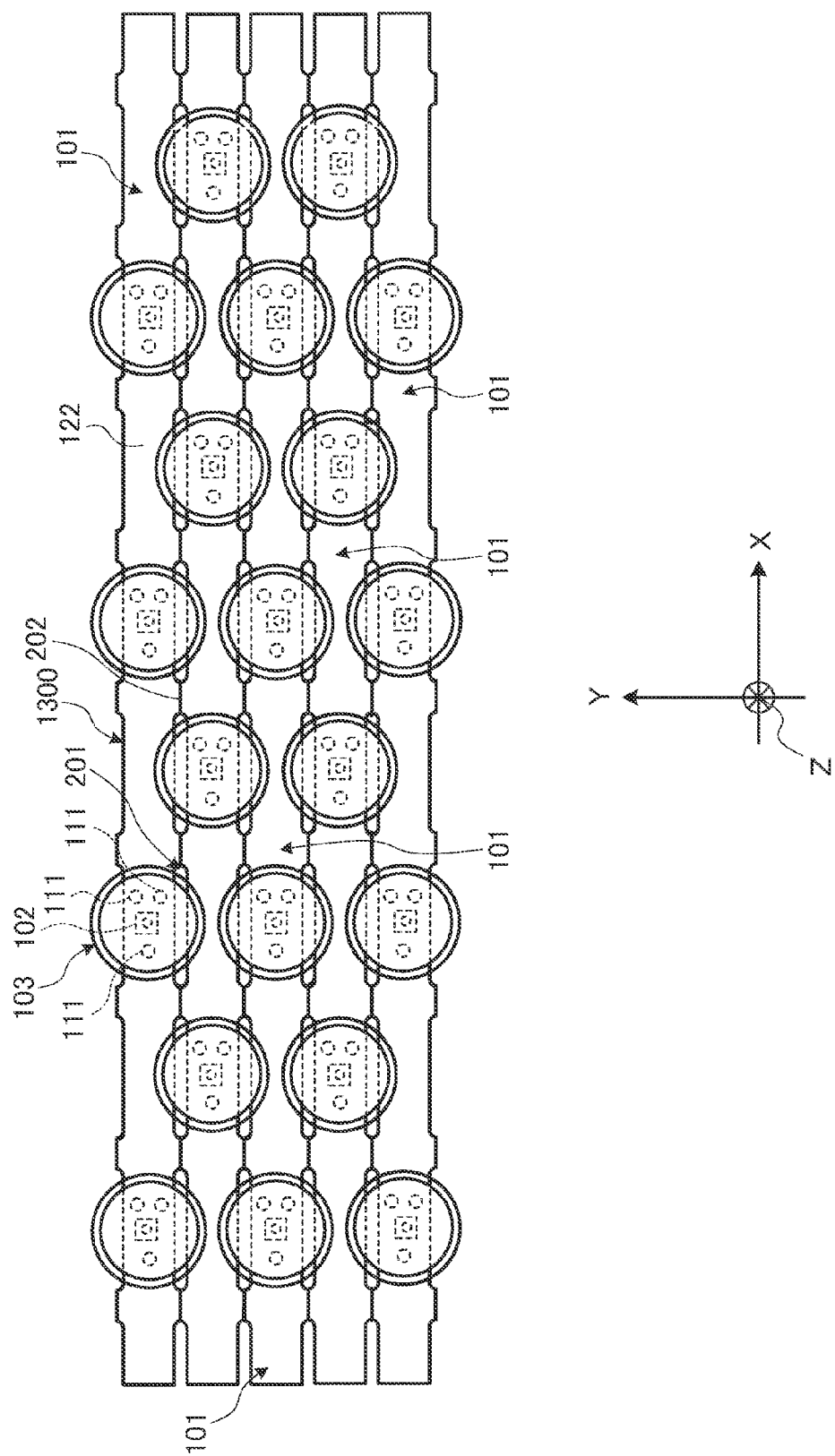
FIG. 15 is a plan view illustrating a multi-surface pattern substrate on which light emitting elements and luminous flux control members according to the second embodiment of the present invention are mounted.

A method of assembling light emitting apparatus 100 according to the present embodiment will be hereinafter described with reference to FIGS. 14 to 15. FIG. 14 is a plan view illustrating multi-surface pattern substrate 1300 on which light emitting elements 102 are mounted. FIG. 15 is a plan view illustrating multi-surface pattern substrate 1300 on which light emitting elements 102 and luminous flux control member 103 are mounted. In FIGS. 14 and 15, X axis, Y axis, and Z axis are perpendicular to each other. In FIGS. 14 and 15 parts having the same configurations as those of FIG. 13 are denoted with the same reference numerals, and description thereof will not be repeated here is omitted.

First, as shown in FIG. 14, light emitting elements 102 are mounted on multi-surface pattern substrate 1300. At this occasion, as shown in FIG. 14, light emitting element 102 is mounted in each part P (a part enclosed by a broken line in FIG. 14) sandwiched between through-holes 201 neighboring each other in a direction (direction parallel to Y axis in FIG. 14) perpendicular to a lengthwise direction of multi-surface pattern substrate 1300 (direction parallel to X axis in FIG. 14) in each of columns L1 to L10.

Subsequently, as shown in FIG. 15, luminous flux control member 103 is mounted in parts on multi-surface pattern substrate 1300 where light emitting element 102 is mounted, so that light emitting element 102 is covered with luminous flux control member 103. In this case, light emitting elements 102 and luminous flux control members 103 are arranged in a checkered pattern on multi-surface pattern substrate 1300 on a plan view.

Subsequently, on multi-surface pattern substrate 1300 in the state as shown in FIG. 15, cutting guide sections 202 on each of lines G1 to G4 in FIG. 15 are cut using a long-bladed cutter, whereby light emitting apparatuses 100 as shown in FIGS. 1 and 2 are formed. At this occasion, it is not necessary to cut through-holes 201 since through-holes 201 already penetrate multi-surface pattern substrate 1300 in the direction parallel to Z axis of FIGS. 14 and 15. Therefore, even when the diameter of the circle of the circular shape of luminous flux control member 103 is larger than the length in the widthwise direction of substrate 101, each substrate 101 can be cut from multi-surface pattern substrate 1300.

It should be noted that the number of substrates formed from one substrate forming member is not limited to what is shown in FIG. 13, and it may be any number.

The configuration of the illuminating apparatus is the same as those of FIGS. 9 and 10, and therefore, description thereabout is omitted.

(Effects of Present Embodiment)

As described above, in the present embodiment, in each line of the multi-surface pattern substrate, through-holes are formed at positions where luminous flux control members are mounted, so that even when the width of the substrate is reduced, the multi-surface pattern substrate can be cut and processed to form the substrates. Therefore, according to the present embodiment, the number of substrates formed from one multi-surface pattern substrate can be increased, and the manufacturing cost can be reduced.

Further, according to the present embodiment, the multi-surface pattern substrate can be cut and processed using a cutter suitable for the length of the cutting guide section, whereby the substrates can be formed. Therefore, a step of cutting each substrate can be automated.

Furthermore, according to the present embodiment, the luminous flux control members are mounted on the multi-surface pattern substrate in a checkered pattern, and this prevents interference between the luminous flux control members when the luminous flux control members are mounted.

(Variation Common to the First and Second Embodiments)

In the first and second embodiments described above, the number of light emitting elements and luminous flux control members mounted on the substrate may be any number.

In the first and second embodiments described above, the positions of the leg sections provided on the luminous flux control member are at the vertexes of the isosceles triangle. However, the present invention is not limited thereto. The positions of the leg section may be at the vertexes of an equilateral triangle or other triangles.

In the first and second embodiments described above, the number of leg sections provided on the luminous flux control member is three. However, the present invention is not limited thereto. The number of leg sections may be any number other than one.

In the first and second embodiments described above, the back surface of the liquid crystal is illuminated. However, the present invention is not limited thereto. A surface to be illuminated in a signboard and the like showing text and drawings may as well be illuminated from inside or from outside.

In the first and second embodiments described above, the cutting guide section is a groove having a predetermined depth from the mount surface. However, the present invention is not limited thereto. Grooves may also be provided on the surface opposite to the mount surface, and the grooves may be in any shape as long as the grooves serve as guides when the multi-surface pattern substrate is cut.

In the first and second embodiments described above, when the luminous flux control members are mounted on the multi-surface pattern substrate, the end parts of the through-holes project from the outer peripheral parts of the luminous flux control members on a plan view. However, the present invention is not limited thereto. The through-holes may not project from the outer peripheral parts of the luminous flux control members as long as the through-holes are formed to the outer peripheral parts of the luminous flux control members on a plan view.

In the first and second embodiments described above, the lengths in the widthwise direction of the substrate are only two different lengths (i.e. W1 and W2). However, the present invention is not limited thereto. The substrate may have three or more different lengths as long as all the lengths in the widthwise direction of the substrate are equal to or less than the diameter of the circle of the circular shape of the luminous flux control member.

The light emitting apparatus and the multi-surface pattern substrate according to the present invention is particularly suitable for illuminating a surface to be illuminated.

What is claimed is:

1. A light emitting apparatus for illuminating a surface to be illuminated, wherein:
    the light emitting apparatus comprises:
    a belt-like substrate;
    a plurality of light emitting elements mounted on a mount surface of the substrate at predetermined intervals along a lengthwise direction of the substrate; and
    a plurality of luminous flux control members mounted on the mount surface at the predetermined intervals along the lengthwise direction, the luminous flux control members respectively receiving lights emitted from the light emitting elements, controlling an arrangement of the incident lights, and emitting the incident lights in an emission direction; and
    the substrate comprises a pair of fracture surfaces formed at predetermined intervals along the lengthwise direction and formed at both ends in a widthwise direction between luminous flux control members neighboring each other along the lengthwise direction, a dimension in the widthwise direction between the pair of fracture surfaces being less than a dimension in the widthwise direction of the luminous flux control member, and the dimension in the widthwise direction of a part overlapping the luminous flux control member in a plan view being less than the dimension in the widthwise direction between the pair of fracture surfaces.

2. An illuminating apparatus comprising:
    the light emitting apparatus according to claim 1; and a surface that is illuminated by light emitted from the luminous flux control member of the light emitting apparatus.

3. A multi-surface pattern substrate that is separated into a plurality of parts and thereby forming a plurality of belt-like substrates on each of which a light emitting element and a luminous flux control member are mounted, the multi-surface pattern substrate comprising:

a mount surface on which the light emitting elements and the luminous flux control members are mounted;

through-holes arranged at predetermined intervals on each separation line serving as a boundary of the separation and penetrating the multi-surface pattern substrate in a thickness direction; and a cutting guide section arranged on the separation line between neighboring through-holes on each separation line, the cutting guide section being a groove made to a predetermined depth from at least one of a back surface or the mount surface serving as a surface of the multi-surface pattern substrate, wherein:

the through-holes are arranged at predetermined intervals on a line perpendicular to the separation line; and in a part sandwiched between neighboring through-holes on the perpendicular line, the luminous flux control member is mounted on the mount surface so as to overlap all or part of the through-hole on a plan view.

* * * * *